United States Patent
Chataigner (12)

(10) Patent No.: US 8,593,232 B2
(45) Date of Patent: Nov. 26, 2013

(54) MULTI-BAND FREQUENCY OSCILLATING DEVICE

(75) Inventor: Emmanuel Chataigner, Crolles (FR)

(73) Assignee: ST-Ericsson SA, Plan-Les-Ouates (CH)

( * ) Notice: Subject to any disclaimer, the term of this patent is extended or adjusted under 35 U.S.C. 154(b) by 0 days.

(21) Appl. No.: 13/379,277

(22) PCT Filed: Jun. 15, 2010

(86) PCT No.: PCT/EP2010/058353
§ 371 (c)(1),
(2), (4) Date: Mar. 15, 2012

(87) PCT Pub. No.: WO2010/146038
PCT Pub. Date: Dec. 23, 2010

(65) Prior Publication Data
US 2012/0169426 A1    Jul. 5, 2012

(30) Foreign Application Priority Data
Jun. 19, 2009    (FR) ..................... 09 54178

(51) Int. Cl.
*H03B 5/08* (2006.01)
(52) U.S. Cl.
USPC ...... 331/167; 331/2; 331/117 R; 331/117 FE; 331/179
(58) Field of Classification Search
USPC .................. 331/2, 179, 117 R, 117 FE, 167
See application file for complete search history.

(56) References Cited

U.S. PATENT DOCUMENTS

| 6,549,096 B2 | 4/2003 | Groves et al. |
| 7,423,495 B2 | 9/2008 | Bevilacqua et al. |
| 8,198,945 B2 * | 6/2012 | Sanduleanu et al. ............ 331/45 |
| 2006/0033587 A1 | 2/2006 | Cabanillas |

FOREIGN PATENT DOCUMENTS

DE    102007023795 A1    12/2008
WO    2006020873 A1    2/2006

OTHER PUBLICATIONS

Patent Cooperation Treaty; International Search Report and Written Opinion of PCT/EP2010/058353; Sep. 9, 2010; H. Fritzsche; 8 pages.
Institut National De La Propriete Industrielle; Rapport de Recherche Preliminaire; French Search Report and Written Opinion; Victoria Robinson; May 19, 2010; 2 pages.
Zahra Safarian et al.: "A 1.3a 6GHz triple-mode CMOS VCO using coupled inductors" Custom Integrated Circuits Conference, 2008. CICC 2008. IEEE, IEEE, Piscataway, NJ, USA, Sep. 21, 2008, pp. 69-72, XP031361414.
Tien-Ling Hsieh et al: "A Reconfigurable Oscillator Topology for Dual-Band Operation", VLSI Design, 2005, 18th International Conference on Kolkata, India Jan. 3-7, 2005, Piscataway, NJ, USA, IEEE LNKD-DOI: 10.1109/ICVD.2005.31, Jan. 3, 2005, pp. 870-873, XP010769953.

(Continued)

*Primary Examiner* — Arnold Kinkead
(74) *Attorney, Agent, or Firm* — Howison & Arnott, L.L.P.

(57) ABSTRACT

An oscillating device is provided that has several oscillators. Each oscillator has a capacitive inductive resonant circuit and a flow-through conduction circuit having a negative flow-through conduction. The inductive elements of the oscillators are mutually coupled. Each oscillator also has short-circuit or not short-circuit the capacitive element of the oscillator. The oscillating device also has a controllable commutating means arranged to activate one oscillator at a time.

7 Claims, 2 Drawing Sheets

(56) References Cited

OTHER PUBLICATIONS

Murat Demirkan, Stephen P. Bruss and Richard R. Spencer, 11.8GHz CMOS VCO With 62% Tuning Range Using Switched Coupled Inductors, Solid-State Circuits Research Laboratory, University of California, Davis, California, 2007 IEEE Radio Frequency Integrated Circuits Symposium, 401-404.

\* cited by examiner

MULTI-BAND FREQUENCY OSCILLATING DEVICE

CROSS-REFERENCE TO RELATED APPLICATIONS

This application is a U.S. National Phase application submitted under 35 U.S.C. §371 of Patent Cooperation Treaty application serial no. PCT/EP2010/058353, filed Jun. 15, 2010, and entitled MULTI-BAND FREQUENCY OSCILLATING DEVICE, which application claims priority to French patent application serial no. FR 0954178, filed Jun. 19, 2009, and entitled MULTI-BAND FREQUENCY OSCILLATING DEVICE.

Patent Cooperation Treaty application serial no. PCT/EP2010/058353, published as WO 2010/146038, and French patent application serial no. FR 0954178, are incorporated herein by reference.

TECHNICAL FIELD

The present invention relates to the field of electronics and more particularly the field of frequency tunable oscillators. Advantageously, but not limitingly, the invention applies to communication systems using such oscillators, for example cellular mobile telephones.

BACKGROUND

The increasing number of communication standards and the centralization of all these standards within a single portable communication apparatus are difficult to achieve. Specifically, in order to transmit and receive on each of the bands concerned by these standards an oscillating element capable of operating continuously on all these frequency bands must be used. An oscillating element comprising a juxtaposition of several oscillating circuits does not allow a continuous operation between the frequency bands. Another oscillating element comprising a single oscillator with a tunable frequency does not allow a sufficient amplitude of frequency variation.

A chosen solution usually consists of using a single circuit supplying several oscillators, making operation possible on several bands. The use of a single circuit also makes it possible to reduce costs and make miniaturization of the electronic circuit easier.

In this type of circuit, the induction coils of each of the oscillators may also be mutually coupled electromagnetically. Therefore, in patents U.S. Pat. No. 7,423,495 and WO 2006/020873, several oscillating circuits are mutually coupled via induction coils. The values of the induction coils vary depending on the modes of the other oscillators and this makes it possible to multiply the number of operating modes.

SUMMARY

According to one embodiment, it is proposed, without increasing the number of oscillators or the number of components, to allow a continuous operation over a broad band of frequencies with operating modes that are yet more numerous and a greater variation of impedances and capacitors during these operating modes.

According to another embodiment, an oscillating device is proposed that provides low consumption and minimum phase noise by tuning via an adjustment of the induction coil and of the capacitor, and not of the capacitor alone.

Also proposed in particular is a continuity between the operating bands of the various oscillators notably by a sharing of elements (ground, the intensity generator, the bias).

According to a first aspect, an oscillating device is proposed comprising several oscillators, each oscillator comprising a capacitive inductive resonant circuit and a flow-through conduction circuit having a negative flow-through conduction, the inductive elements of the oscillators being mutually coupled.

According to a general feature of this aspect, each oscillator also comprises a controllable switch arranged to short-circuit or not short-circuit the capacitive element of the oscillator and the device also comprises controllable commutating means arranged to activate one oscillator at a time.

Therefore, on the one hand, added to the operating modes of each of the oscillators taken separately are combined operating modes covering other frequency bands. On the other hand, amongst these combined operating modes, operating modes corresponding to the short-circuited capacitor in each of the oscillators are added. The added operating modes make it possible to vary the value of capacitance and therefore also inductance over a very wide range, the amplitude of frequency is therefore greater. Moreover, by tuning via an adjustment of more numerous parameters, i.e. inductance and capacitance, it is possible to optimize each of these parameters in order to obtain low consumption and minimum phase noise.

According to one embodiment, the controllable switch of each oscillator is connected in parallel to the capacitive element of the oscillator.

According to another embodiment, the oscillating device comprises first control means capable of short-circuiting the capacitive element of at least one oscillator that is not activated.

The great variation of capacitance may, if it follows a short circuit in the inactive oscillator, allow a variation of inductance in the active oscillator.

According to an additional embodiment, the first commutating means comprises several commutators respectively connected between the flow-through conduction circuits of the oscillators and a common ground terminal and the device comprises second control means capable of closing only one commutator at a time.

This allows continuity between the operating bands of the oscillators sharing the same elements.

According to another embodiment, the inductive elements of the oscillators are superposed on one another.

Therefore, by creating magnetic coupling via a superposition of the induction coils, a gain in surface area is achieved. This gain in surface area allows a lower frequency-pulling effect (caused by another signal being coupled to the induction coils of the oscillator).

BRIEF DESCRIPTION OF THE DRAWINGS

Other advantages and features of the invention will appear on studying the detailed description of methods of application and embodiment taken as non-limiting examples and illustrated by the appended drawings in which.

DETAILED DESCRIPTION

Figure 1:
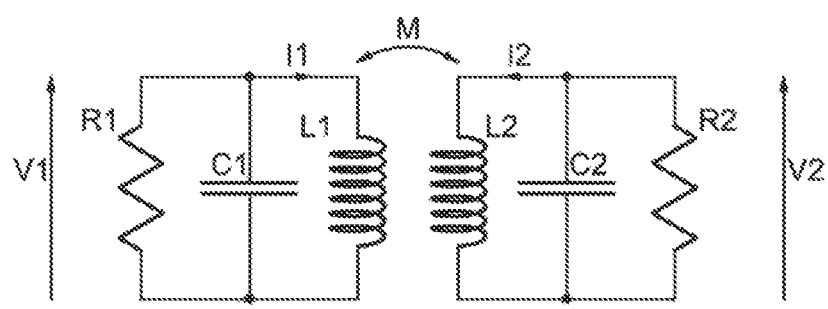
FIG. 1 illustrates a simple circuit comprising two coupled oscillators.

FIG. 1 shows an oscillator having two inductive elements which are coupled. This simple circuit makes it possible to establish equations governing the behaviour of the mutually coupled inductive elements.

The first oscillator comprises a resistor R1, a capacitor C1 and a coil L1. Similarly, the second circuit comprises a resistor R2, a capacitor C2 and a coil L2. The two circuits are coupled electromagnetically via the two coils L1 and L2 with a mutual coefficient of inductance M.

Therefore, the voltages V1 and V2 and the intensities i1 and i2 follow the conditions below expressed in complex notation:

$$V1=j.L1.w.I1+j.M.w.I2$$

$$V2=j.L2.w.I2+j.M.w.I1$$

where $|M|=k\cdot\sqrt{L1\cdot L2}$, k is the coupling coefficient depending in particular on the mutual arrangement of the coils.

In the particular case in which V2=0, that is to say when the capacitor C2 is short-circuited:

$$I2=-(M/L2).I1$$

Therefore, seen from R1, the complex impedance in the first oscillator is equivalent to a capacitor C1 in parallel with a coil the induction of which is equal to $L1.(1-k2)$.

If there is no short circuit, V2 can be expressed in the form:

$$V2=-I2/(C2.j.w), \text{ and}$$

$$I2=I1.(C2.M.w2)/(1-L2.C2.w2).$$

Therefore, seen from R1, the complex impedance in the first oscillator is equal to a capacitor in parallel with a coil the induction of which is: $L1.(1-k2.L2.C2.w2/(L2.C2.w2-1))$.

Figure 2:
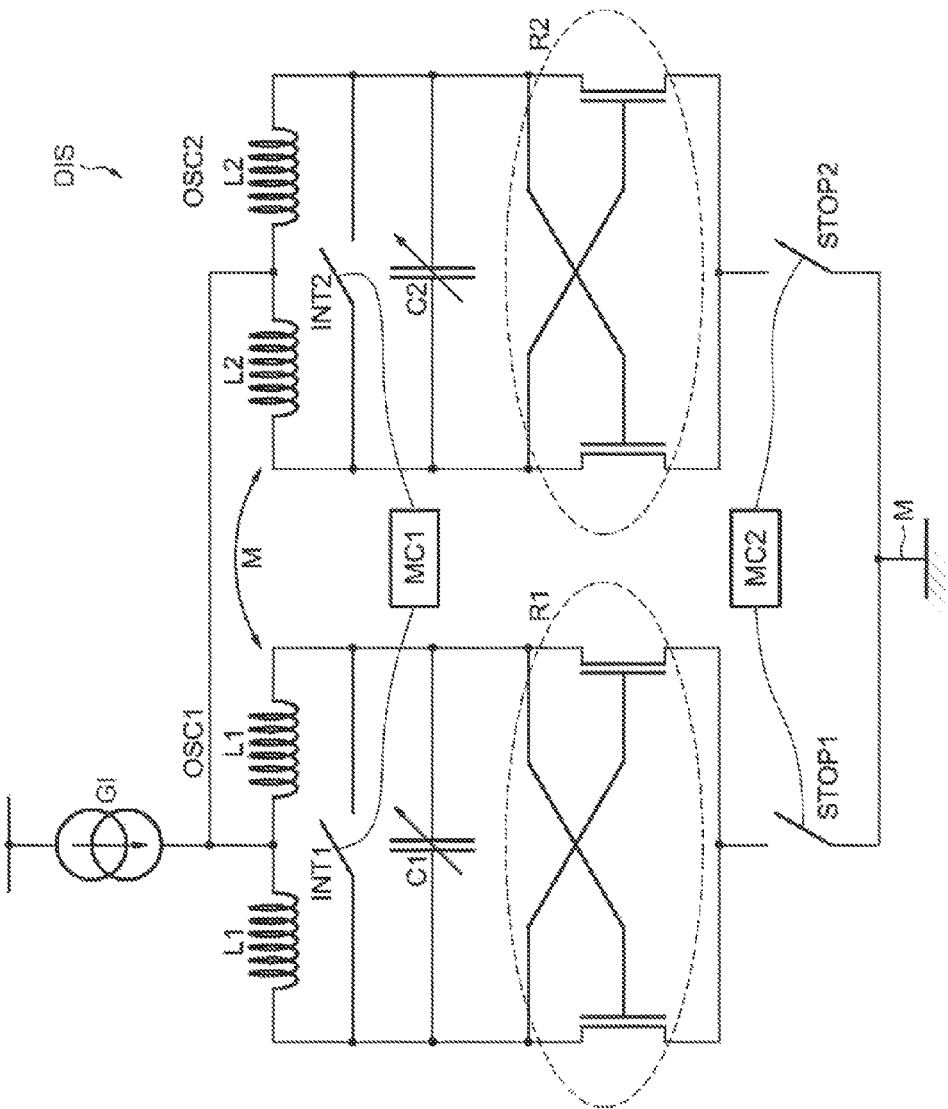
FIG. 2 illustrates an example of a circuit comprising two oscillators and two negative flow-through conductors.

FIG. 2 illustrates an example of a device DIS according to the invention. The latter comprises an intensity generator GI, two oscillators OSC1 and OSC2 and an earth terminal M. This being so, the invention is not limited to two oscillators but may comprise several oscillators mutually coupled by their respective induction coils.

Each of the two oscillators comprises a mid-point to which two induction coils L1 & L1 or L2 & L2 are connected. Each of the induction coils L1 or L2 is mutually coupled with one of the induction coils L2 or L1 respectively. In parallel with the two induction coils there are first of all a switch INT1 or INT2 and a variable and adjustable capacitor C1 or C2. When the switch INT1 or INT2 is closed, respectively the capacitor C1 or C2 is short-circuited. In addition, in parallel with the two induction coils, in each oscillator there is a flow-through conduction circuit G1 or G2 having a negative flow-through conduction. The negative flow-through conduction makes it possible to compensate for the losses and to maintain the oscillations. The operation of each of the flow-through conduction circuits may be optimized for the frequency bands of each of the oscillators. Each flow-through conduction circuit is formed in this instance for example of two MOS transistors of which the two links to the gate are crossed.

Each of the two oscillators is also connected via a commutator STOP1 or STOP2 to the ground terminal M. They may therefore be activated/deactivated by the commutating means STOP1 and STOP2. When the commutator STOP1 or STOP2 is closed, respectively the oscillator OSC1 or OSC2 is activated.

The circuit illustrated in FIG. 2 also comprises control means MC2 capable of controlling the commutating means (STOP1, STOP2) so that only one of the oscillators is active. Finally, means MC1 are capable of controlling the switches INT1 and INT2. The means MC1 and MC2 collaborate so that only the capacitor of an inactive oscillator can be short-circuited. The control means MC1, MC2 can be produced for example based on logic circuits.

The considerable number of parameters that can be adjusted (value of inductance, value of coupling, value of the capacitors, size of the flow-through conduction circuits) allows a sufficient number of degrees of freedom to make possible an effective optimization of each of the oscillators. Therefore, it is possible to adjust these parameters so as to obtain a superposition of all the frequency bands and good performance with respect to phase noise and power consumption.

Moreover, the short-circuiting of the capacitors C1 and C2 in the oscillators OSC1 and OSC2, respectively, makes it possible to add operating modes that are six in number, with each making it possible to cover a frequency band. The calculations of the values of the induction coils after they are coupled in the circuit of FIG. 1 can apply to the circuit of FIG. 2 and therefore:

Mode 1: Oscillator active: OSC2, value of inductance after coupling in OSC2: $L2.(1-k2.L1.C1.w2/(L1.C1.w2-1))$, value of C1 close to its minimum and C2 varies from its minimum value to half of its maximum value. The band covered by the specific frequency then ranges from 6.3 to 7 GHz.

Mode 2: Oscillator active: OSC2, value of the induction coil $L2.(1-k2.L1.C1.w2/(L1.C1.w2-1))$, value of C1 at its maximum and C2 varies from its minimum value to its maximum value. The band covered by the specific frequency then ranges from 5.6 to 6.8 GHz.

Mode 3: Oscillator active: OSC2, C1 is short-circuited, value of inductance after coupling in OSC2: $L2.(1-k2)$ and C2 varies from its minimum value to its maximum value. The band covered by the specific frequency then ranges from 5.1 to 6.5 GHz.

Mode 4: Oscillator active: OSC1, C2 is short-circuited, value of inductance after coupling in the active oscillator: $L1.(1-k2)$ and C1 varies from its minimum value to its maximum value. The band covered by the specific frequency then ranges from 3.8 to 5.4 GHz.

Mode 5: Oscillator active: OSC1, value of inductance after coupling in the active oscillator: $L1.(1-k2.L2.C2.w2/(L2.C2.w2-1))$, C1 varies from the minimum value to its maximum value and value of C2 close to its minimum. The band covered by the specific frequency then ranges from 3.2 to 4.2 GHz.

Mode 6: Oscillator active OSC1, value of inductance after coupling in the active oscillator: $L1.(1-k2.L2.C2.w2/(L2.C2.w2-1))$, C1 varies from its minimum value to its maximum value and value of C2 close to its maximum. The band covered by the specific frequency then ranges from 3 to 3.5 GHz.

The frequency band values have been obtained with capacitors and induction coils having the following values L1=750 pH, C1=3.2 pF (maximum value), L2=510 pH, C2=4.2 pF (maximum value).

The invention as described allows the production of an oscillator of which the variation of specific frequency is of the order of +/−40% around 5 GHz. The best oscillators LC according to the prior art allow variations of +/−30% around 4.5 GHz.

Compared with a conventional solution that uses two oscillators to cover the same frequency band, the invention embodiments also allow a gain in surface area by creating the magnetic coupling by superposition of the induction coils on one another. This gain in surface area allows a lower frequency-pulling effect (caused by another signal being coupled to the induction coils of the oscillator). Overall, the invention makes it possible to take advantage of the coupling between the coils instead of installing devices in order to avoid it.

The invention also makes it possible to have a single oscillating device capable of covering, for example, the frequency bands of the GSM, DCS, TDD-WCDMA, FDD-WCDMA standards required for the operation of current cellular mobile telephones with a sufficiently low phase noise to be compatible with the specifications required by these communication standards.

The invention claimed is:

1. An oscillation device comprising:
   at least two oscillator circuits, wherein each oscillator circuit comprises:
      a capacitive inductive resonant circuit comprising a capacitive element electrically connected to an inductive element;
      a flow-through conduction circuit adapted to provide negative flow-through conduction to the inductive element; and
      a controllable switch arranged to short-circuit or not short-circuit the capacitive element; wherein the inductive elements of the at least two oscillators are mutually coupled; and
   a controllable commutator arranged to activate one of the at least two oscillator circuits at a time, the controllable commutator comprises a plurality of commutators each connected between the flow-through conduction circuit and a ground connection.

2. The oscillation device of claim 1, wherein the controllable switch of each oscillator circuit is connected in parallel with the capacitive element of that oscillator circuit.

3. The oscillation device of claim 1, further comprising a controller device capable of short-circuiting the capacitive element of at least one oscillator circuit that is not active.

4. The oscillating device of claim 1, further comprising a controller device adapted to close one of the plurality of commutators at a time.

5. The oscillating device of claim 1, wherein the inductor elements of the at least two oscillators are superposed on one another.

6. An oscillating circuit comprising:
   a first oscillator circuit comprising:
      a first capacitive inductive resonant circuit having a first capacitive element and a first inductive element;
      a first flow-through conduction circuit adapted to provide negative flow-through conduction to the first inductive element; and
      a first controllable switch arranged to short-circuit or not short circuit the first capacitive element; and
   a second oscillator circuit comprising:
      a second capacitive inductive resonant circuit having a second capacitive element and a second inductive element;
      a second flow-through conduction circuit adapted to provide negative flow-through conduction to the second inductive element; and
      a second controllable switch arranged to short-circuit or not short circuit the second capacitive element; wherein the first and second inductive elements of at least the first and the second oscillator circuits are mutually coupled and superimposed on each other; and
   a controllable commutator arranged to activate at least one of the first and the second oscillator circuits at a time, the controllable commutator comprises at least a first and a second commutator device respectively connected between the first and second flow-through conduction circuits and a ground connection.

7. The oscillating circuit of claim 6, further comprising a first control circuit adapted to control at least the first and second controllable switch.

* * * * *